United States Patent
Lin

(10) Patent No.: US 10,992,275 B2
(45) Date of Patent: Apr. 27, 2021

(54) AUTOMATIC GAIN CONTROL CIRCUIT OF TRANSIMPEDANCE AMPLIFIER

(71) Applicant: XIAMEN UX HIGH-SPEED IC CO., LTD., Fujian (CN)

(72) Inventor: Shaoheng Lin, Xiamen (CN)

(73) Assignee: XIAMEN UX HIGH-SPEED IC CO., LTD., Fujian (CN)

(*) Notice: Subject to any disclaimer, the term of this patent is extended or adjusted under 35 U.S.C. 154(b) by 0 days.

(21) Appl. No.: 16/975,140

(22) PCT Filed: Mar. 7, 2018

(86) PCT No.: PCT/CN2018/078203
§ 371 (c)(1),
(2) Date: Aug. 24, 2020

(87) PCT Pub. No.: WO2019/169566
PCT Pub. Date: Sep. 12, 2019

(65) Prior Publication Data
US 2020/0412314 A1 Dec. 31, 2020

(51) Int. Cl.
*H03G 3/30* (2006.01)
(52) U.S. Cl.
CPC ................ *H03G 3/3063* (2013.01)
(58) Field of Classification Search
CPC ..................................... H03G 3/306
See application file for complete search history.

(56) References Cited

U.S. PATENT DOCUMENTS

| 5,796,309 A * | 8/1998 | Nguyen | H03G 7/08 330/110 |
|---|---|---|---|
| 6,894,564 B1 * | 5/2005 | Gilbert | H03F 3/45 330/254 |
| 7,372,329 B1 * | 5/2008 | Tan | H03F 1/08 330/253 |
| 2005/0200421 A1 * | 9/2005 | Bae | H03F 3/08 330/308 |
| 2006/0001493 A1 * | 1/2006 | Harms | H03F 3/087 330/308 |
| 2011/0068860 A1 * | 3/2011 | Baud | H04N 5/3591 330/7 |
| 2014/0306760 A1 * | 10/2014 | Piepenstock | H03F 3/45085 330/261 |
| 2021/0028748 A1 * | 1/2021 | Barabas | H03F 3/082 |

* cited by examiner

*Primary Examiner* — Patricia T Nguyen
(74) *Attorney, Agent, or Firm* — Leong C. Lei

(57) ABSTRACT

An automatic gain control circuit of a transimpedance amplifier includes a transimpedance amplifier TIA1, a transimpedance amplifier TIA2, an NMOS transistor Q1, an NMOS transistor Q2, an error amplifier U3, and a bias current source Ib. An input terminal and an output terminal of the transimpedance amplifier TIA1 are connected to a drain and a source of the NMOS transistor Q1, respectively. An input terminal and an output terminal of the transimpedance amplifier TIA2 are connected to a drain and a source of the NMOS transistor Q2, respectively. An output terminal of the bias current source Ib is connected to a positive input terminal of the error amplifier U3 and the drain of the MOS transistor Q2.

4 Claims, 4 Drawing Sheets

AUTOMATIC GAIN CONTROL CIRCUIT OF TRANSIMPEDANCE AMPLIFIER

BACKGROUND OF THE INVENTION

1. Field of the Invention

The present invention relates to a transimpedance amplifier, and more particularly to an automatic gain control circuit of a transimpedance amplifier

2. Description of the Prior Art

In the modern high-speed fiber-optic communication system, TIA (Trans-Impedance Amplifier) converts and amplifies a weak photodiode current signal into a voltage signal for further use by the circuit. Placed at the most front-end of the receiver, TIA is the core component in the receiver of the fiber-optic communication system. Its core indicators, such as noise, sensitivity and dynamic range, basically determine the performance of the entire receiving system.

Input dynamic range is also an important indicator. It is defined as the difference between the saturation input power and sensitivity. Saturation input power and sensitivity are respectively defined as the maximum and minimum input power within an acceptable range of error. Sensitivity is mainly determined by the equivalent input noise; the smaller the equivalent input noise, the higher the sensitivity. On the other hand, saturation input power is mainly determined by the output signal's pulse-width distortion, etc. For obtaining better sensitivity indicator, the transimpedance value RF needs to be as big as the bandwidth allows; and the greater the transimpedance, the smaller the saturation input power.

In practice, the TIA normally has an AGC (Automatic Gain Control) circuit to solve the problem, i.e. large transimpedance is maintained with smaller input power and transimpedance is automatically reduced with larger input power, ensuring that the output signal does not generate too much pulse-width distortion, thus widening the dynamic range.

AGC function normally uses an adjustable active resister placed in parallel with a feedback resistor to achieve transimpedance adjustment. There are two commonly used methods to test if the input power is so large that it causes excess output pulse-width distortion. One of which tests the AC output range of the TIA, as shown in FIG. 1, and the other tests changes in the output DC level of the TIA, as shown in FIG. 2.

Both methods require the addition of a low-pass filter in the feedback loop to filter out high frequency component in order to maintain transimpedance stability and reduce the jitter of the output signal. Normally, to ensure acceptable jitter, the low cutoff frequency in the AGC loop must be as low as a few dozens of KHz. As low cutoff frequency exists in the AGC loop and the low cutoff frequency is relatively low, the AGC loop requires a longer settling time, usually about a few dozens of μs. Thus, both types of AGC loops are only suitable for use in continuous communication mode.

In a PON (Passive Optical Network) system, at the OLT (Optical Line Terminal) receives signals in burst mode, i.e. dozens of ONUs (Optical Network Units) take turns to transmit signals to the OLT. As the optical power and transmission distance of each ONU is different, optical signals received by the OLT are characterized by time series bursts and optical power changes, as shown in FIG. 3.

PON primarily consists of GPON and EPON. GPON is far more difficult to achieve due to its use of NRZ coding and more stringent time series requirements. GPON is used as the example for explanation purpose. A typical GPON burst-mode data packet is as shown in FIG. 4. A burst-mode data packet is composed of preamble (36 ns), delimiter (16 ns), valid data (NRZ code) and inter-packet gap (26 ns). When the OLT receives a burst-mode data packet, the entire burst-mode receiving system must establish stable working condition within the preamble time series, i.e. 36 ns, in order to accurately process subsequent valid data signals.

Thus, if traditional AGC method is used, requiring the AGC loop to stabilize itself within 36 ns, the low cutoff frequency of the AGC feedback loop cannot be too low, theoretically not lower than 5 MHz. As NRZ is used as the GPON signal code and the longest CID (consequential identical digit) is up to 72 bits, when transmitting such code signals, the low cutoff frequency of the AGC loop has to be sufficiently low to minimize DC wandering, reducing jitter. The existence of such a conflict is the reason why the traditional AGC loop is not suitable for use in the burst-mode GPON receiving system.

To overcome the above-described conflict, as shown in FIG. 5 and FIG. 6, the existing burst-mode automatic gain control circuit uses a voltage-controlled shunt element in parallel with the feedback resistor RF of the transimpedance amplifier TIA to clamp the output range of the transimpedance amplifier TIA. As shown in FIG. 5, the voltage-controlled shunt element may be a diode D. As shown in FIG. 6, the voltage-controlled shunt element may be a MOS transistor Q using diode connection. When the current of the input signal reaches a certain size, the output voltage of the transimpedance amplifier TIA decreases, causing the voltage drop of the feedback resistor RF to increase until the voltage-controlled shunt element is activated. The voltage-controlled shunt element splits out some of the current of the input signal, ensuring that the output range of the transimpedance amplifier TIA does not continue to surge, thus limiting the TIA output range of the transimpedance amplifier TIA. However, this method has a disadvantage. The turn-on voltage threshold of the typical diode is approximately 0.7V. Even when a MOSFET transistor using diode connection is used, the turn-on voltage threshold is basically above 0.4V. Normally, TIA output range has to be within 0.2 Vpp to prevent obvious distortion. Therefore, in general, the voltage-controlled shunt element can only use a device with a special low threshold to achieve a fast response of automatic gain control of the transimpedance amplifier, which will not only increase the technical cost but also requires special technical support and many commercial techniques do not support such specialized device.

SUMMARY OF THE INVENTION

The primary object of the present invention is to provide an automatic gain control circuit of a transimpedance amplifier to overcome the deficiencies of the prior art.

In order to achieve the above object, the solution of the present invention is described below.

An automatic gain control circuit of a transimpedance amplifier comprises a transimpedance amplifier TIA1, a transimpedance amplifier TIA2, an NMOS transistor Q1, an NMOS transistor Q2, an error amplifier U3, and a bias current source Ib. The transimpedance amplifier TIA2 and the transimpedance amplifier TIA1 have an identical circuit structure, size and process parameter. The NMOS transistor Q1 and the NMOS transistor Q2 have an identical turn-on voltage threshold. An input terminal of the transimpedance amplifier TIA1 is connected to a drain of the NMOS transistor Q1. An output terminal of the transimpedance amplifier TIA1 is connected to a source of the NMOS transistor Q1. An input terminal of the transimpedance amplifier TIA2 is connected to a drain of the NMOS transistor Q2. An output terminal of the transimpedance amplifier TIA2 is connected to a source of the NMOS transistor Q2. A positive input terminal and a negative input terminal of the error amplifier U3 are connected to the input terminal and the output terminal of the transimpedance amplifier TIA2, respectively. An output terminal of the error amplifier U3 is connected to a gate of the NMOS transistor Q1 and a gate of the NMOS transistor Q2. An input terminal of the bias current source Ib is connected to a working power supply VDD. An output terminal of the bias current source Ib is connected to the positive input terminal of the error amplifier U3 and the drain of the MOS transistor Q2.

The transimpedance amplifier TIA1 includes an inverting amplifier U1 and a resistor R1. The transimpedance amplifier TIA2 includes an inverting amplifier U2 and a resistor R2. An input terminal and an output terminal of the inverting amplifier U1 are connected to two ends of the resistor R1, respectively. The input terminal of the inverting amplifier U1 serves as the input terminal of the transimpedance amplifier TIA1. The output terminal of the inverting amplifier U1 serves as the output terminal of the transimpedance amplifier TIA1. An input terminal and an output terminal of the inverting amplifier U2 are connected to two ends of the resistor R2, respectively. The input terminal of the inverting amplifier U2 serves as the input terminal of the transimpedance amplifier TIA2. The output terminal of the inverting amplifier U2 serves as the output terminal of the transimpedance amplifier TIA2.

The inverting amplifier U1 includes a resistor R01, an NMOS transistor M1, and an NMOS transistor M2. A gate of the NMOS transistor M2 serves as the input terminal of the inverting amplifier U1. A source of the NMOS transistor M2 is grounded. A drain of the NMOS transistor M2 is connected to a source of the NMOS transistor M1. A gate of the NMOS transistor M1 is connected to a bias power supply Vb. A drain of the NMOS transistor M1 serves as the output terminal of the inverting amplifier U1. The drain of the NMOS transistor M1 is connected to one end of the resistor R01. Another end of the resistor R01 is connected to the working power supply VDD. The inverting amplifier U2 includes a resistor R02, an NMOS transistor M3, and an NMOS transistor M4. The NMOS transistor M3 and the NMOS transistor M1 have an identical turn-on voltage threshold. The NMOS transistor M4 and the NMOS transistor M2 have an identical turn-on voltage threshold. The resistor R02 and the resistor R01 have an identical resistance. A gate of the NMOS transistor M4 serves as the input terminal of the inverting amplifier U2. A source of the NMOS transistor M4 is grounded. A drain of the NMOS transistor M4 is connected to a source of the NMOS transistor M3. A gate of the NMOS transistor M3 is connected to the bias power supply Vb. A drain of the NMOS transistor M3 serves as the output terminal of the inverting amplifier U2. The drain of the NMOS transistor M3 is connected to one end of the resistor R02. Another end of the resistor R02 is connected to the working power supply VDD.

The bias current source Ib has an output current between zero and 1 microampere.

After adopting the above solution, the transimpedance amplifier TIA1 is used to access an input signal, while the transimpedance amplifier TIA2 itself has no input signal access. The error amplifier and the NMOS transistor Q2 form two negative feedback loops. When no input signal is input to the transimpedance amplifier TIA1, the voltage of the input terminal and the voltage of the output terminal of the transimpedance amplifier TIA2 are equal to the voltage of the input terminal and the voltage of the output terminal of the transimpedance amplifier TIA1. That is, at this time, the transimpedance amplifier TIA2 copies the transimpedance amplifier TIA1. The voltage of the input terminal and the voltage of the output terminal of the transimpedance amplifier TIA2 are equal to the voltage of the input terminal and the voltage of the output terminal of the transimpedance amplifier TIA1 when no input signal is input to the transimpedance amplifier TIA1. Then, the voltage of the gate and the voltage of the drain of the NMOS transistor Q1 are also equal to the voltage of the gate and the voltage of the drain of the NMOS transistor Q2, respectively. The NMOS transistor Q1 and the NMOS transistor Q2 are in the same working state when no input signal is input to the transimpedance amplifier TIA1.

In the present invention, when no input signal is input to the transimpedance amplifier TIA1, the voltage of the gate of the NMOS transistor Q1 does not change. The voltage of the source of the NMOS transistor Q1 gradually decreases with the increase of the current of the input signal of the transimpedance amplifier TIA1, so that the NMOS transistor Q1 is gradually turned on to shunt part of the current of the input signal, and the output voltage of the transimpedance amplifier TIA1 is clamped within a certain range. When no input signal is input to the transimpedance amplifier TIA1, the NMOS transistor Q2 and the NMOS transistor Q1 are in a critical conduction state by controlling the bias current source Ib to output a micro current. Thus, the voltage of the source of the NMOS transistor Q1 only needs a small change to make the NMOS transistor Q1 be fully turned on. Therefore, the NMOS transistor Q1 can shunt part of the current of the input signal. It is not necessary for the difference in the voltage of the source of the NMOS transistor Q1 to reach the turn-on voltage threshold of the NMOS transistor Q1, thereby achieving a fast response.

In summary, the NMOS transistor Q1 and the NMOS transistor Q2 of the present invention do not need to use a device with a low turn-on voltage threshold. The NMOS transistor Q1 and the NMOS transistor Q2 adopt a device with a common turn-on voltage threshold to realize the fast response of the automatic gain control of the transimpedance amplifier TIA1.

DETAILED DESCRIPTION OF THE PREFERRED EMBODIMENTS

Embodiments of the present invention will now be described, by way of example only, with reference to the accompanying drawings.

Figure 1:
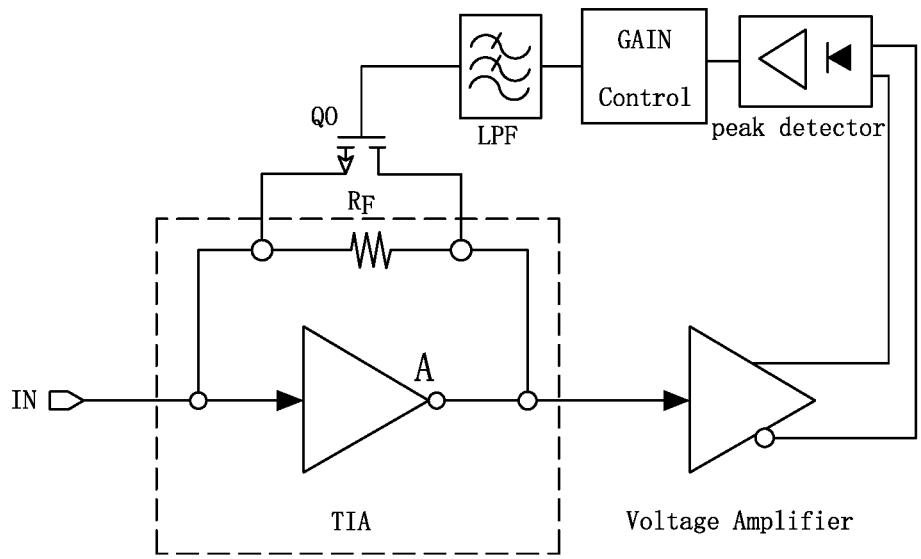
FIG. 1 is an automatic gain control circuit for detecting the AC output range of a conventional transimpedance amplifier TIA.
Figure 2:
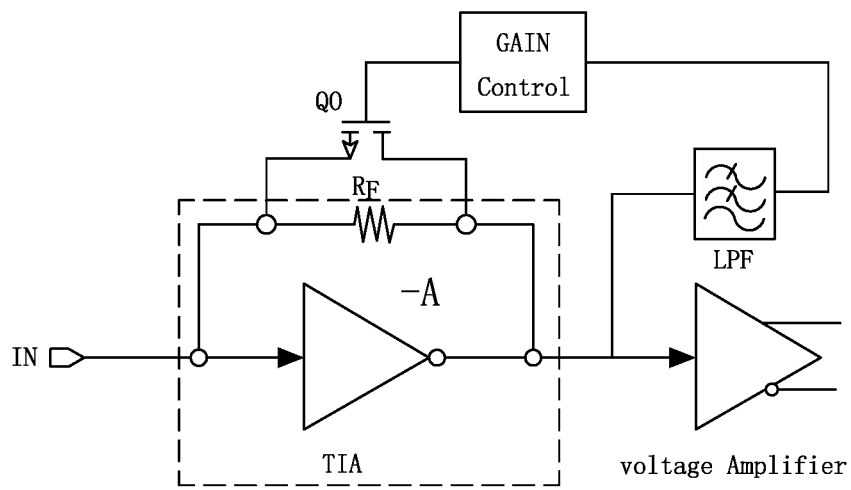
FIG. 2 is an automatic gain control circuit for detecting the output DC level change of the conventional transimpedance amplifier TIA.
Figure 3:
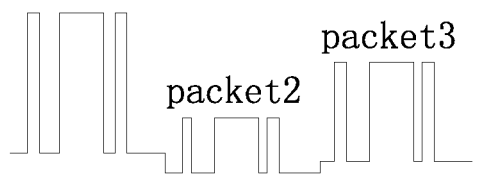
FIG. 3 is a time series diagram of the optical signals received by the OLT.
Figure 4:
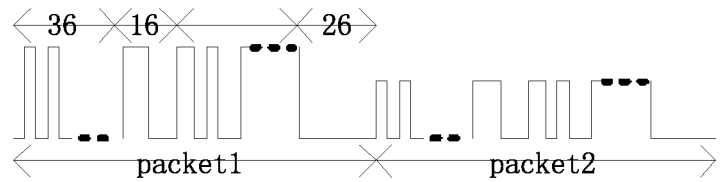
FIG. 4 is a schematic view of a conventional GPON burst-mode data packet.
Figure 5:
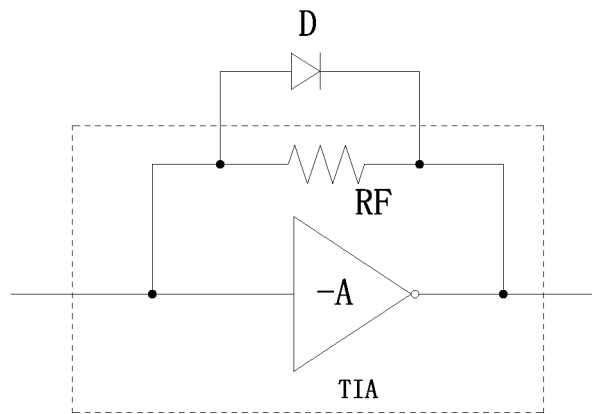
FIG. 5 is a first circuit diagram of a conventional burst-mode AGC circuit.
Figure 6:
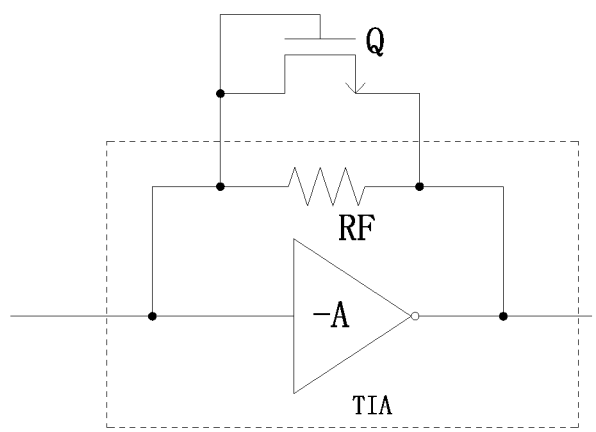
FIG. 6 is a second circuit diagram of the conventional burst-mode AGC circuit.
Figure 7:
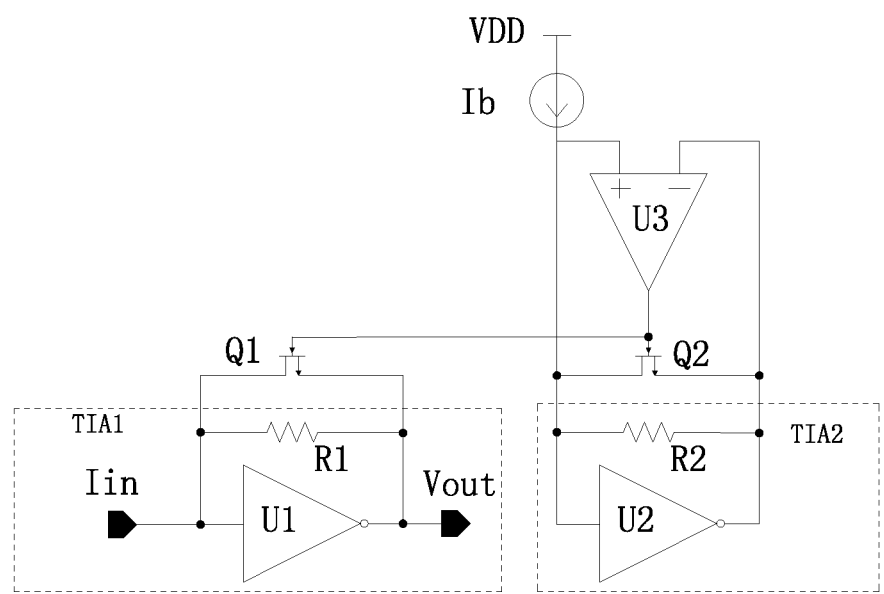
FIG. 7 is a schematic diagram of the overall circuit of the present invention.

As shown in FIG. 7, the present invention discloses an automatic gain control circuit of a transimpedance amplifier, comprising a transimpedance amplifier TIA1, a transimpedance amplifier TIA2, an NMOS transistor Q1, an NMOS transistor Q2, an error amplifier U3, and a bias current source Ib. The transimpedance amplifier TIA2 and the transimpedance amplifier TIA1 have an identical circuit structure, size and process parameter. The NMOS transistor Q1 and the NMOS transistor Q2 have an identical turn-on voltage threshold. The transimpedance amplifier TIA1 includes an inverting amplifier U1 and a resistor R1. The transimpedance amplifier TIA2 includes an inverting amplifier U2 and a resistor R2. An input terminal and an output terminal of the inverting amplifier U1 are connected to two ends of the resistor R1, respectively. The input terminal of the inverting amplifier U1 serves as an input terminal of the transimpedance amplifier TIA1, and the output terminal of the inverting amplifier U1 serves as an output terminal of the transimpedance amplifier TIA1. An input terminal and an output terminal of the inverting amplifier U2 are connected to two ends of the resistor R2, respectively. The input terminal of the inverting amplifier U2 serves as an input terminal of the transimpedance amplifier TIA2, and the output terminal of the inverting amplifier U2 serves as an output terminal of the transimpedance amplifier TIA2.

Specifically, the input terminal of the transimpedance amplifier TIA1 is connected to a drain of the NMOS transistor Q1. The output terminal of the transimpedance amplifier TIA1 is connected to a source of the NMOS transistor Q1. The input terminal of the transimpedance amplifier TIA2 is connected to a drain of the NMOS transistor Q2. The output terminal of the transimpedance amplifier TIA2 is connected to a source of the NMOS transistor Q2. A positive input terminal and a negative input terminal of the error amplifier U3 are connected to the input terminal and the output terminal of the transimpedance amplifier TIA2, respectively. An output terminal of the error amplifier U3 is connected to a gate of the NMOS transistor Q1 and a gate of the NMOS transistor Q2. An input terminal of the bias current source Ib is connected to a working power supply VDD. An output terminal of the bias current source Ib is connected to the positive input terminal of the error amplifier U3 and the drain of the MOS transistor Q2.

In order to facilitate understanding of the inverting amplifier U1 and the inverting amplifier U2, the specific structures of the inverting amplifier U1 and the inverting amplifier U2 are specifically explained below. It should be noted that the technical idea of the present invention may be applied to other types of inverting amplifier U1 and inverting amplifier U2, and is not limited to the inverting amplifier U1 and the inverting amplifier U2 described below.

Figure 8:
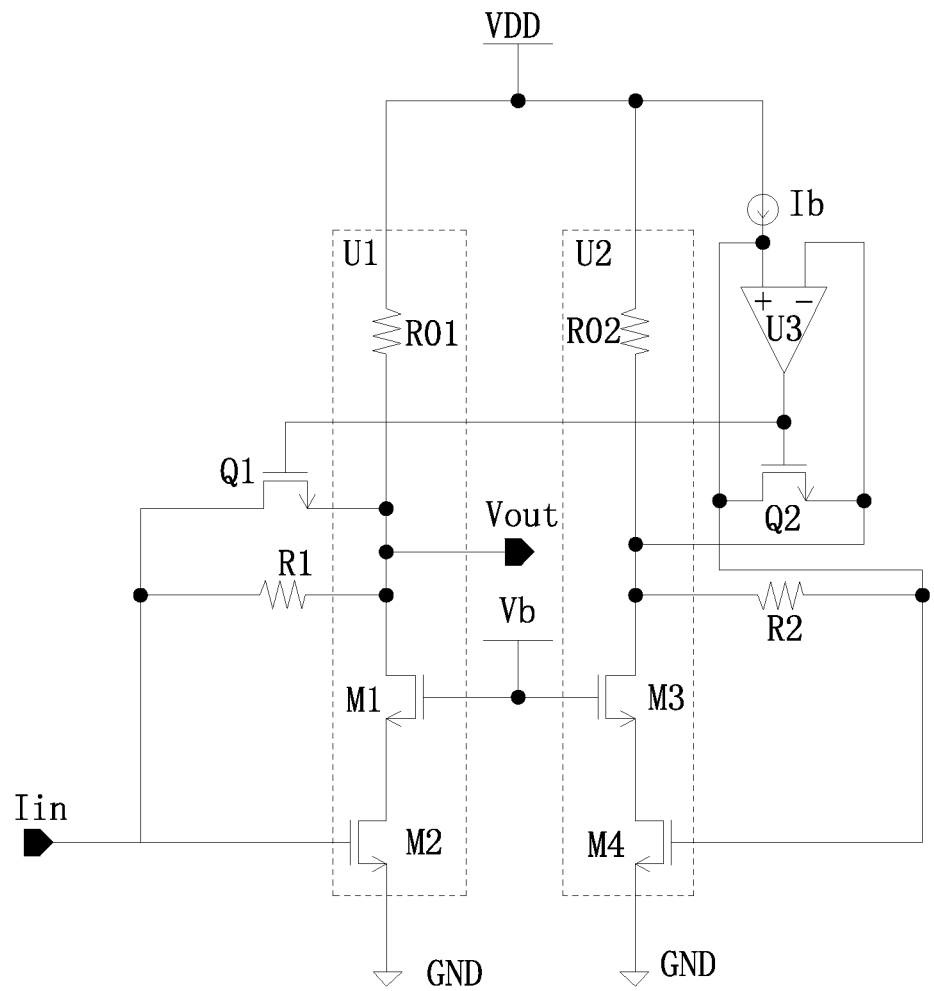
FIG. 8 is a schematic diagram of a specific circuit of the present invention.

As shown in FIG. 8, the inverting amplifier U1 is a cascode amplifier. The inverting amplifier U1 includes a resistor R01, an NMOS transistor M1, and an NMOS transistor M2. A gate of the NMOS transistor M2 serves as the input terminal of the inverting amplifier U1. A source of the NMOS transistor M2 is grounded. A drain of the NMOS transistor M2 is connected to a source of the NMOS transistor M1. A gate of the NMOS transistor M1 is connected to a bias power supply Vb. A drain of the NMOS transistor M1 serves as the output terminal of the inverting amplifier U1. The drain of the NMOS transistor M1 is connected to one end of the resistor R01, and another end of the resistor R01 is connected to the working power supply VDD.

As shown in FIG. 8, the inverting amplifier U2 is a cascode amplifier. The inverting amplifier U2 includes a resistor R02, an NMOS transistor M3, and an NMOS transistor M4. The NMOS transistor M3 and the NMOS transistor M1 have an identical turn-on voltage threshold. The NMOS transistor M4 and the NMOS transistor M2 have an identical turn-on voltage threshold. The resistor R02 and the resistor R01 have an identical resistance. A gate of the NMOS transistor M4 serves as the input terminal of the inverting amplifier U2. A source of the NMOS transistor M4 is grounded. A drain of the NMOS transistor M4 is connected to a source of the NMOS transistor M3. A gate of the NMOS transistor M3 is connected to the bias power supply Vb. A drain of the NMOS transistor M3 serves as the output terminal of the inverting amplifier U2. The drain of the NMOS transistor M3 is connected to one end of the resistor R02, and another end of the resistor R02 is connected to the working power supply VDD.

The transimpedance amplifier TIA1 of the present invention is used to access an input signal, while the transimpedance amplifier TIA2 itself has no input signal access. The error amplifier and the NMOS transistor Q2 form two negative feedback loops. According to the "virtual short" principle of negative feedback, the voltage of the input terminal of the transimpedance amplifier TIA2 (that is, the voltage of the drain of the NMOS transistor Q2) and the voltage of the output terminal of the transimpedance amplifier TIA2 (that is, the voltage of the source of the NMOS transistor Q2) are almost equal. When no input signal is input to the transimpedance amplifier TIA1, the voltage of the input terminal of the transimpedance amplifier TIA1 (that is, the voltage of the drain of the NMOS transistor Q1) and the voltage of the output terminal of the transimpedance amplifier TIA1 (that is, the voltage of the source of the NMOS transistor Q1) are equal. Therefore, it can be obtained that the voltage of the input terminal and the voltage of the output terminal of the transimpedance amplifier TIA2 are equal to the voltage of the input terminal and the voltage of the output terminal of the transimpedance amplifier TIA1 when no input signal is input to the transimpedance amplifier TIA1. Then, the voltage of the gate and the voltage of the drain of the NMOS transistor Q1 are also equal to the voltage of the gate and the voltage of the drain of the NMOS transistor Q2, respectively. Moreover, since the gate of the NMOS transistor Q1 is connected to the gate of the NMOS transistor Q2, it can be seen that when no input signal is input to the transimpedance amplifier TIA1, the NMOS transistor Q1 and the NMOS transistor Q2 are in the same working state. The voltage of the gate of the NMOS transistor Q2 meets the following formula:

$$V_{G\_Q2}=V_{S\_Q2}+V_{GS\_Q2}=V_{S\_Q2}+[(2I_dL)/(\mu C_{ox}W)]^{0.5}+V_{th};$$

wherein: $V_{G\_Q2}$ is the voltage of the gate of the NMOS transistor Q2; $V_{S\_Q2}$ is the voltage of the source of the NMOS transistor Q2; $V_{GS\_Q2}$ is the voltage drop between the gate and the source of the NMOS transistor Q2; $I_d$ is the current flowing through the NMOS transistor Q2; L is the channel length of the NMOS transistor Q2; W is the channel width of the NMOS transistor Q2; μ is the electron-transfer rate; $C_{ox}$ is the gate oxide capacitance per unit area of the NMOS transistor Q2; $V_{th}$ is the turn-on voltage threshold of the NMOS transistor Q1 and the NMOS transistor Q2.

$I_d$ is a component of the output current of the bias current source Ib. If the output current of the bias current source Ib is controlled to be close to zero, for example, the output current of the bias current source Ib is between zero and 1 microampere, then $I_d$ can be considered as zero. At this time:

$$V_{G\_Q2}=V_{S\_Q2}+V_{GS\_Q2}=V_{S\_Q2}+V_{th};$$

$$V_{GS\_Q2}=V_{th},$$

Therefore, when the output current of the bias current source Ib is close to zero, the NMOS transistor Q2 is in a critical conduction state. When no input signal is input to the transimpedance amplifier TIA1, the NMOS transistor Q1 and the NMOS transistor Q2 are in the same working state. Therefore, when no input signal is input to the transimpedance amplifier TIA1, the output current of the bias current source Ib is close to zero so that the NMOS transistor Q1 is also in a critical conduction state.

In the present invention, when no input signal is input to the transimpedance amplifier TIA1, the voltage of the gate of the NMOS transistor Q1 does not change. The voltage of the source of the NMOS transistor Q1 gradually decreases with the increase of the current of the input signal of the transimpedance amplifier TIA1, so that the NMOS transistor Q1 is gradually turned on to shunt part of the current of the input signal, and the output voltage of the transimpedance amplifier TIA1 is clamped within a certain range. When no input signal is input to the transimpedance amplifier TIA1, the NMOS transistor Q2 and the NMOS transistor Q1 are in a critical conduction state by controlling the bias current source Ib to output a micro current. Therefore, when the transimpedance amplifier TIA1 has an input signal, the voltage of the source of the NMOS transistor Q1 only needs a small change to make the NMOS transistor Q1 be fully turned on. Therefore, the NMOS transistor Q1 can shunt part of the current of the input signal. It is not necessary for the difference in the voltage of the source of the NMOS transistor Q1 to reach the turn-on voltage threshold of the NMOS transistor Q1, thereby achieving a fast response.

In summary, the NMOS transistor Q1 and the NMOS transistor Q2 of the present invention do not need to use a device with a low turn-on voltage threshold. The NMOS transistor Q1 and the NMOS transistor Q2 adopt a device with a common turn-on voltage threshold to realize the fast response of the automatic gain control of the transimpedance amplifier TIA1.

Although particular embodiments of the present invention have been described in detail for purposes of illustration, various modifications and enhancements may be made without departing from the spirit and scope of the present invention. Accordingly, the present invention is not to be limited except as by the appended claims.

What is claimed is:

1. An automatic gain control circuit of a transimpedance amplifier, comprising a transimpedance amplifier TIA1, a transimpedance amplifier TIA2, an NMOS transistor Q1, an NMOS transistor Q2, an error amplifier U3, and a bias current source Ib; the transimpedance amplifier TIA2 and the transimpedance amplifier TIA1 having an identical circuit structure, size and process parameter; the NMOS transistor Q1 and the NMOS transistor Q2 having an identical turn-on voltage threshold;

an input terminal of the transimpedance amplifier TIA1 being connected to a drain of the NMOS transistor Q1;

an output terminal of the transimpedance amplifier TIA1 being connected to a source of the NMOS transistor Q1;

an input terminal of the transimpedance amplifier TIA2 being connected to a drain of the NMOS transistor Q2; an output terminal of the transimpedance amplifier TIA2 being connected to a source of the NMOS transistor Q2;

a positive input terminal and a negative input terminal of the error amplifier U3 being connected to the input terminal and the output terminal of the transimpedance amplifier TIA2, respectively; an output terminal of the error amplifier U3 being connected to a gate of the NMOS transistor Q1 and a gate of the NMOS transistor Q2;

an input terminal of the bias current source Ib being connected to a working power supply VDD, an output terminal of the bias current source Ib being connected to the positive input terminal of the error amplifier U3 and the drain of the MOS transistor Q2.

2. The automatic gain control circuit of the transimpedance amplifier as claimed in claim 1, wherein the transimpedance amplifier TIA1 includes an inverting amplifier U1 and a resistor R1; the transimpedance amplifier TIA2 includes an inverting amplifier U2 and a resistor R2;

an input terminal and an output terminal of the inverting amplifier U1 are connected to two ends of the resistor R1, respectively; the input terminal of the inverting amplifier U1 serves as the input terminal of the transimpedance amplifier TIA1, the output terminal of the inverting amplifier U1 serves as the output terminal of the transimpedance amplifier TIA1;

an input terminal and an output terminal of the inverting amplifier U2 are connected to two ends of the resistor R2, respectively; the input terminal of the inverting amplifier U2 serves as the input terminal of the transimpedance amplifier TIA2, the output terminal of the inverting amplifier U2 serves as the output terminal of the transimpedance amplifier TIA2.

3. The automatic gain control circuit of the transimpedance amplifier as claimed in claim 2, wherein the inverting amplifier U1 includes a resistor R01, an NMOS transistor M1, and an NMOS transistor M2;

a gate of the NMOS transistor M2 serves as the input terminal of the inverting amplifier U1; a source of the NMOS transistor M2 is grounded, a drain of the NMOS transistor M2 is connected to a source of the NMOS transistor M1, a gate of the NMOS transistor M1 is connected to a bias power supply Vb, a drain of the NMOS transistor M1 serves as the output terminal of the inverting amplifier U1, the drain of the NMOS transistor M1 is connected to one end of the resistor R01, another end of the resistor R01 is connected to the working power supply VDD; the inverting amplifier U2 includes a resistor R02, an NMOS transistor M3, and an NMOS transistor M4; the NMOS transistor M3 and the NMOS transistor M1 have an identical turn-on voltage threshold; the NMOS transistor M4 and the NMOS transistor M2 have an identical turn-on voltage threshold; the resistor R02 and the resistor R01 have an identical resistance;

a gate of the NMOS transistor M4 serves as the input terminal of the inverting amplifier U2; a source of the NMOS transistor M4 is grounded, a drain of the NMOS transistor M4 is connected to a source of the NMOS transistor M3, a gate of the NMOS transistor M3 is connected to the bias power supply Vb, a drain of the NMOS transistor M3 serves as the output terminal of the inverting amplifier U2, the drain of the NMOS transistor M3 is connected to one end of the resistor R02, and another end of the resistor R02 is connected to the working power supply VDD.

4. The automatic gain control circuit of the transimpedance amplifier as claimed in claim 1, wherein the bias current source Ib has an output current between zero and 1 microampere.

\* \* \* \* \*